United States Patent [19]

Aoki et al.

[11] Patent Number: 5,672,912
[45] Date of Patent: Sep. 30, 1997

[54] RESIN-SEALED TYPE SEMICONDUCTOR DEVICE AND METHOD FOR MANUFACTURING THE SAME

[75] Inventors: Kazumasa Aoki, Tsuyama; Yoshiki Sota, Tenri, both of Japan

[73] Assignee: Sharp Kabushiki Kaisha, Osaka, Japan

[21] Appl. No.: 684,186

[22] Filed: Jul. 19, 1996

[30] Foreign Application Priority Data

Nov. 21, 1995 [JP] Japan ............................ 7-303004

[51] Int. Cl.⁶ .......................... H01L 21/60; H01L 23/48; H01L 23/12
[52] U.S. Cl. .......................... 257/693; 257/780; 257/735; 257/738; 257/730
[58] Field of Search .......................... 257/693, 780, 257/777, 778, 723, 730, 738, 673, 697, 735, 725

[56] References Cited

U.S. PATENT DOCUMENTS

| | | | |
|---|---|---|---|
| 4,710,798 | 12/1987 | Marcantonio | 257/778 |
| 5,172,303 | 12/1992 | Bernardoni et al. | 257/693 |
| 5,239,198 | 8/1993 | Lin et al. | 257/693 |
| 5,281,151 | 1/1994 | Arima et al. | 257/778 |
| 5,521,435 | 5/1996 | Mizukoshi | 257/780 |

FOREIGN PATENT DOCUMENTS

| | | | |
|---|---|---|---|
| 0083054 | 7/1981 | Japan | 257/780 |
| 0030544 | 2/1992 | Japan | 257/780 |
| 0370958 | 12/1992 | Japan | 257/778 |
| 6-77293 | 3/1994 | Japan . | |
| 06140462A | 5/1994 | Japan . | |

*Primary Examiner*—Tom Thomas
*Assistant Examiner*—Alexander Oscar Williams
*Attorney, Agent, or Firm*—Nixon & Vanderhye

[57] ABSTRACT

A resin-sealed type semiconductor device comprising a semiconductor chip having an electrode pad, a wiring component composed of a wiring layer formed on one side of an insulating board, a through-hole penetrating through the insulating board and a projecting electrode formed on the other side of the insulating board and at the position corresponding to the through-hole, wherein the semiconductor chip and the wiring component are disposed so that the electrode pad and the projecting electrode are welded together, and at least the gap between the semiconductor chip and the wiring component is sealed with a resin.

11 Claims, 15 Drawing Sheets

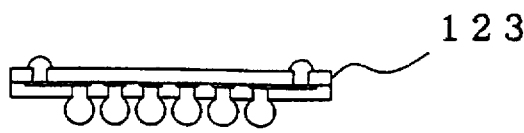
Fig. 20 (a) (1)
(PRIOR ART)
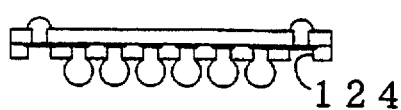
Fig. 20 (a) (2)
(PRIOR ART)
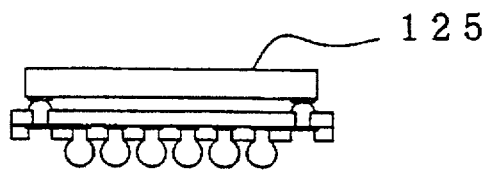
Fig. 20 (a) (3)
(PRIOR ART)
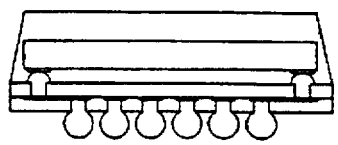
Fig. 20 (a) (4)
(PRIOR ART)
Fig. 20 (b) (1)
(PRIOR ART)
Fig. 20 (b) (2)
(PRIOR ART)
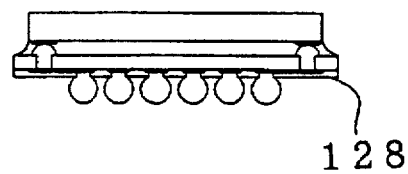
Fig. 20 (b) (3)
(PRIOR ART)

RESIN-SEALED TYPE SEMICONDUCTOR DEVICE AND METHOD FOR MANUFACTURING THE SAME

BACKGROUND OF THE INVENTION

1. Field of the Invention

The present invention relates to a resin-sealed type semiconductor device and a method for manufacturing the same. More particularly, the present invention relates to a resin-sealed type semiconductor device having a structure such that a sufficient heat can be supplied to an electrode pad and a projecting electrode which are to be welded onto each other, and to a method for manufacturing the same.

2. Description of the Related Arts

In accordance with the development of high density mounting of resin-sealed type semiconductor devices on a printed circuit board, size reduction of the resin-sealed type semiconductor devices has been taking place. For example, Japanese Laid-open (Kokai) Patent Application Nos. Hei 6(1994)-140462 and Hei 6(1994)-77293 disclose resin-sealed type semiconductor devices having a small size, as shown in FIGS. 18 and 19.

Referring to FIG. 18, the reference numeral 104 represents a semiconductor chip; 105 an electrode pad, 106 a wiring component; 107 a dielectric layer of the wiring component such as an insulating board; 108 a wiring layer of the wiring component; 109 a projecting electrode of the wiring component, 110 an opening for forming an external connection terminal; 111 the external connection terminal; and 112 a sealing resin. On the other hand, referring to FIG. 19, the reference numeral 113 represents a semiconductor chip; 114 an electrode pad, 115 a wiring component; 116 a dielectric layer of the wiring component such as an insulating board; 117 a wiring layer of the wiring component; 118 a projecting electrode of the wiring component, 119 a through-hole; 120 the opening for forming an external connection terminal; 121 the external connection terminal; and 122 a sealing resin. Both of the resin-sealed type semiconductor devices shown in FIGS. 18 and 19 have a structure such that a semiconductor chip is welded facedown onto the wiring component formed of an insulating board.

A method for manufacturing these resin-sealed type semiconductor devices will be explained hereinafter. For example, in the case of resin-sealed type semiconductor device shown in FIG. 18, a conventional film (dielectric layer 107) for TAB (tape automated bonding) is used as a base material for the wiring component. A plurality of wiring layers 108 having a predetermined shape are then formed on one side of the dielectric layer 107, with one end of the wiring layer 108 reaching a position of contact to the electrode pad 105 to form a projecting electrode 109 at the position. The other end of the wiring layer 108 is connected to a position where an external connection terminal is to be formed. At this position, the opening 110 is formed through the dielectric layer 107. The projecting electrode 109 of the wiring component and the electrode pad 105 are welded onto each other. The periphery of the semiconductor chip 104 is then sealed with the sealing resin 112 so as to protect the device from external influences. External connection terminals 111 for mounting are then formed on the surface of the wiring component 106 which is opposite to the surface where the semiconductor chip 104 has been welded. This resin-sealed type semiconductor device is characterized in that the external connection terminal 111 for mounting is formed through the opening 110 of the wiring component and that the wiring layer 108 is formed on the side of the wiring component which is in contact with the semiconductor chip.

In the case of resin-sealed type semiconductor device in FIG. 19, the wiring component 115 comprises the wiring layer 117 disposed between two dielectric layers 116 having a thickness of 5 to 150 μm, with one end of the wiring layer 117 reaching the position of contact to the semiconductor chip electrode, at which position the projecting electrode 118 is formed via the through-hole 119 formed through one dielectric layer. The other end of the wiring layer extends to a position where the external connection terminal is to be formed, at which position the external connection terminal 121 is formed via the opening 120 formed through the other dielectric layer. The semiconductor chip 113 is then welded onto the above wiring component, followed by sealing with a resin to complete the device.

As illustrated in the above FIGS. 18 and 19, these resin-sealed type semiconductor devices show a structure such that the semiconductor chip is welded facedown via the projecting electrode formed on the wiring layer, with the external connection terminal for mounting being formed on the other side of the wiring layer. Also, the projecting electrode, the wiring layer, and the external connection terminal are electrically connected to the electrode pad of the semiconductor chip to form an electric circuit.

According to the above structure of resin-sealed type semiconductor device, it is possible to make the size of the resin-sealed type semiconductor device as small as the size of the semiconductor chip because the electric circuit connecting the electrode pad of the semiconductor chip to the external connection terminal is formed below the semiconductor chip. Also, the size of the device can be reduced when compared with a conventional TAB. Further, since the device comprises the wiring layer patterned into an electric circuit connecting the electrode pad of the semiconductor chip to the external connection terminals, it is possible to freely design the arrangement of external connection terminals.

In the above resin-sealed type semiconductor device, there remains a gap between the semiconductor chip and the wiring component until the device is sealed with a resin. The projecting electrode and the wiring layer (in the case of FIG. 19, only the projecting electrode) exist in the gap. The semiconductor chip and the wiring component are in contact with each other with the help of the projecting electrode only, so that nothing else holds the semiconductor chip and the insulating board in place until the device is sealed with a resin.

In the resin-sealed type semiconductor device, it is necessary to protect, from the influence of the external environment, at least the surface having the electrode pad of the semiconductor chip and the vicinity of the projecting electrode which is welded onto the electrode pad, so that the device is sealed with a resin. In other words, it is necessary to fill in the gap between the semiconductor chip and the wiring component with a resin. In the process of assembling a resin-sealed type semiconductor device, the sealing with a resin is conducted by injecting a melted thermoplastic resin or a thermosetting resin into the gap or by pressingly injecting the resin in a metal mold. Accordingly, when the sealing with a resin is conducted after the semiconductor chip and the wiring component are welded, the melted resin flows through the gap between the semiconductor chip and the insulating board toward the center. However, since the size of the gap is as small as several tens of μm, it is not easy to fill in the gap with the resin.

Accordingly, several methods are known in which, before a semiconductor chip is welded onto the wiring component, the sealing resin is laminated on the semiconductor chip or the wiring component, followed by heating and melting to bring them into contact. In a method, for example, the sealing resin such as epoxy resin or polyimide resin is formed on an electric circuit side of the semiconductor chip or on the wiring component. In another method, a film-like resin is inserted between the semiconductor chip and the wiring component before they are welded.

In the conventional resin-sealed type semiconductor devices of FIGS. 18 and 19, the contact between the semiconductor chip and the wiring component is formed by welding the projecting electrode formed on the wiring component onto the electrode of the semiconductor chip. This welding of the electrode pad and the projecting electrode surface is carried out by heating and pressing. The heating temperature is about 400° C. This heat is conducted to the semiconductor chip and the wiring component as well. Since the semiconductor chip is made of silicon and the base of the wiring component is an insulating board made of polyimide resin, there will occur a location discrepancy between the electrode pad and the projecting electrode due to the difference in thermal expansion coefficient. This renders the alignment between the electrode pad and the projecting electrode difficult.

Also, since the electrode pad and the projecting electrode are welded in a heated condition, the semiconductor chip and the wiring component are brought into contact in their expanded state. When the step of welding (and sealing by resin) is finished, the product is released from its heated state and returns to the state of ordinary temperature. At this stage, the semiconductor chip and the wiring component tend to contract with different contraction coefficients. This generates a location discrepancy at the point of contact. Since the point of contact is fixed, a shear stress is generated at the point of contact. Such a shear stress at the point of contact will be a cause of decrease in reliability at the point of contact.

The electrode pad and the projecting electrode are welded by applying a heating and pressing instrument for welding (hereinafter referred to as "welding instrument") onto the back side of the projecting electrode for the purpose of heating and pressing. In a conventional resin-sealed type semiconductor device, the back side of the projecting electrode is covered with a dielectric layer such as an insulating board. Therefore, the welding instrument was applied onto the dielectric layer for heating and pressing. This raises a problem that the insulating board is melted and also a problem that the point of contact is insufficiently heated. Since the portion of the insulating board to which the welding instrument is directly applied is heated at about 400° C. and pressed, the insulating board may possibly melt. Also, since the projecting electrode on the wiring layer is heated via the insulating board formed of resin, insufficient heat may possibly be applied to the projecting electrode, causing a poor contact.

Further, if a dielectric layer should not exist at the portion to which the welding instrument is applied, an opening must be formed in advance at that portion of the dielectric layer by laser processing or by etching. This opening must be formed corresponding to each electrode location of the semiconductor chip as well as the opening for forming a projecting electrode. If nothing is formed at the opening in the end, the wiring layer remains in an exposed state, so that the opening must be stuffed after the semiconductor chip is welded. Thus, the formation of the opening leads to increased costs, hence disadvantageous if the reduction of costs is desired.

The resin-sealed type semiconductor devices shown in FIGS. 18 and 19 have a structure such that the electric circuit side of the semiconductor chip is welded onto the insulating board of the wiring component via the projecting electrode, and the gap between the semiconductor chip and the wiring component is sealed with resin. The insulating board of the wiring component is made of polyimide resin or the like. Here, a translucent resin film such as used in TAB is utilized. Also, in the resin-sealed type semiconductor devices of FIGS. 18 and 19, the semiconductor chip is welded to the wiring component via the projecting electrode. The bump which forms the projecting electrode has a size of approximately several tens of μm, so that the gap between the semiconductor chip and the wiring component has a width of approximately several tens of μm. This gap is filled with resin for sealing. Thus, the resin-sealed type semiconductor devices of FIGS. 18 and 19 comprise an insulating board of approximately several tens to 100 μm and a sealing resin of approximately several tens of μm formed on the electric circuit side of the semiconductor chip.

Since the thicknesses of the insulating board and the sealing resin on the semiconductor chip are as thin as several tens to 100 μm in this structure, an erroneous operation may possibly occur if a light penetrates through the insulating board and the sealing resin. In the case of resin-sealed type semiconductor devices shown in FIGS. 18 and 19, the possibility is high.

SUMMARY OF THE INVENTION

The present invention provides a resin-sealed type semiconductor device comprising a semiconductor chip having an electrode pad, a wiring component composed of a wiring layer formed on one side of an insulating board, a through-hole penetrating through the insulating board and a projecting electrode formed on the other side of the insulating board and at the position corresponding to the through-hole, wherein the semiconductor chip and the wiring component are disposed so that the electrode pad and the projecting electrode are welded together, and at least the gap between the semiconductor chip and the wiring component is sealed with a resin.

Further, the present invention provides a method for manufacturing a resin-sealed type semiconductor device, the method comprising the steps of forming a wiring layer on one side of an insulating board, forming a through-hole penetrating through the insulating board, the through-hole being formed on the other side of the insulating board and at a position corresponding to the location of an electrode pad of a semiconductor chip to be welded, forming a wiring component by forming a projecting electrode on the wiring layer and through the through-hole, sealing at least the gap between the semiconductor chip and the wiring component with a resin and welding the electrode pad and the projecting electrode together by heating the wiring layer.

BRIEF DESCRIPTION OF THE DRAWINGS

FIG. 20(a) (1) to (a) (4) is a schematic view of a process for comparing a manufacturing method of a conventional resin-sealed type semiconductor device.

FIG. 20(b) (1) to (b) (3) is a schematic view of a process for comparing a manufacturing method of a resin-sealed type semiconductor device according to the present invention.

DETAILED DESCRIPTION OF THE PREFERRED EMBODIMENTS

Figure 1:
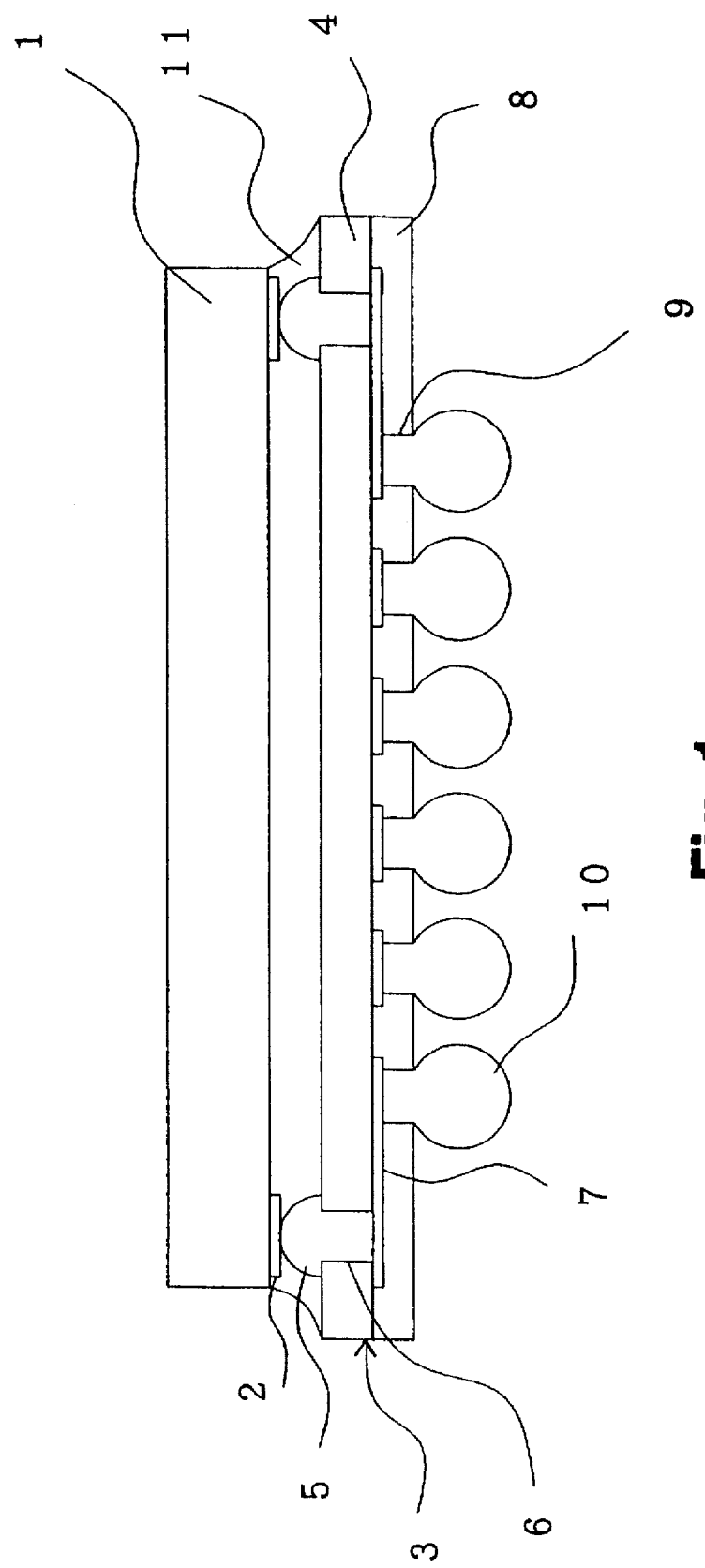
FIG. 1 is a schematic sectional view showing a resin-sealed type semiconductor device according to the present invention.

The semiconductor chip constituting the resin-sealed type semiconductor device of the present invention is not specifically limited, and any kind of chip may be used. Also, the shape, the number and the like of the electrode pad in the semiconductor chip are not specifically limited and may be suitably selected. The material for the electrode pad may be aluminum, alloy of aluminum or the like that are generally used.

The wiring component comprises at least an insulating board, a wiring layer, a through-hole, and a projecting electrode.

The insulating board is not specifically limited as long as it is a resin board having a high heat resistance (which may be film-like). Examples of the material for the insulating board include polyimide, glass epoxy, BT resin, polyester, polyamide, Teflon, ceramic, and glass polyester, among which polyimide is preferable.

Examples of the material for the wiring layer include Cu, Al, Au, and Ni, among which Cu is preferable due to its low cost. The method for forming the wiring layer on the insulating board may be, for example, a vapor deposition method or a plating method. In order to pattern the wiring layer into a desired shape, a known photolithography method may be used. Here, an adhesive layer may be formed between the insulating board and the wiring layer.

One end of the wiring layer reaches a position where a projecting electrode is to be formed, at which position a through-hole is formed through the insulating board. The method for forming a through-hole may be a drilling method, a die cutting (perforation) method, an etching method, and a laser processing method. Specifically, the through-hole may be formed after the wiring layer is formed on one side of the insulating board. Alternatively, the through-hole may be formed through the insulating board and the adhesive layer formed on one side thereof, and then a wiring layer may be formed through the intermediary of the adhesive layer.

Next, a projecting electrode is formed at the position corresponding to the through-hole. Preferably, the above wiring layer is formed inside from projecting electrodes for size reduction of the semiconductor device. The projecting electrode may be formed of a material similar to that of the wiring layer. Preferably, Cu is used as a major component in the material for the projecting electrode because it can reduce the costs. Further, the surface to be welded is preferably laminated with Au through the intermediary of Ni in view of having a good welding property. It is preferably that two equally spaced electrode pads, and the wiring component has at least two projecting electrodes disposed with the almost same spacing as the electrode pads.

After the projecting electrode of the wiring component and the electrode pad of the semiconductor chip are welded together, at least the gap between the semiconductor chip and the wiring component is sealed with resin. The resin for sealing is not specifically limited as long as it has an insulation property. Examples of the resin include epoxy, silicone, phenol, and polyimide.

External connection terminals may be formed on the other end of the above wiring layer and in a direction opposite to the projecting electrode. The external connection terminals may be formed in an area-array configuration on the wiring layer. Further, the external connection terminals may be formed of a known solder material. If solder is to be used for external connection terminals, the formation of the external connection terminals is conducted preferably at the last step of assembling the resin-sealed type semiconductor device so as to prevent undesired melting of solder with heat generated at the time of welding the semiconductor chip and the wiring component or at the time of sealing with resin.

Further, a protection film may be formed on the wiring layer of the wiring component except the portion on which the external connection terminals are formed. This protection film may be formed beforehand on the wiring component or during the process of manufacturing the resin-sealed type semiconductor device. Preferably, the material for the protection film is the same as that of the insulating board in view of thermal expansion and contraction. The resin-sealed type semiconductor device thus manufactured has a structure in which the wiring layer is covered with the insulating board and the protection film.

Since the resin-sealed type semiconductor device of the present invention has a structure such that a semiconductor chip is welded facedown, via a bump, on a wiring component which comprises an insulating board of about several tens of μm in thickness, there are problem inherent in this structure. Means for solving these problems will be hereinafter explained.

First, in a conventional resin-sealed type semiconductor device, the alignment between the semiconductor chip and the wiring component has been difficult at the time of welding due to the difference in thermal expansion and contraction coefficient, and at the time of heating due to the location discrepancy at the point of contact. Also, there has been a problem that a shear stress is generated at the point of contact after the welding.

In order to prevent location discrepancy between the semiconductor chip electrode and the projecting electrode due to the difference in expansivity at the time of heating, there is provided a method such that the position of the projecting electrode of the wiring component is corrected beforehand at ordinary temperature to match the position of the projecting electrode with the position of the semiconductor chip electrode after expansion. The degree (amount) of location discrepancy of the projecting electrode can be determined by measuring the difference of location at the point of contact or by calculation from thermal expansion coefficients.

By compensating for the location discrepancy beforehand, it is possible to match the positions of the electrode pad and the projecting electrode in the semiconductor chip and the wiring component, which have been expanded at different thermal coefficients.

In order to compensate for the location discrepancy, it is preferable to form a groove in a surface of the insulating board of the wiring component on which the projecting electrode is formed. The groove can be of any shape as long as it can absorb the above location discrepancy. For example, the groove may have a wedge-like or rectangular cross section. Since the groove deforms on contraction, it absorbs the location discrepancy caused by the contraction of the insulating board, thereby alleviating the shear stress generated at the point of contact.

Second, in order to solve the problem of the melting of the portion on the dielectric layer of the insulating board to which the welding instrument is applied, and to solve the problem of insufficient heating due to the heating of the projecting electrode via the dielectric layer by the welding instrument, it is preferable that, at the time of welding, no dielectric layer is formed on at least the portion of the wiring component to which a welding instrument is applied. In this case, the projecting electrode is heated and pressed via the exposed wiring layer. After the welding, a protection film may be formed on the exposed portion of the wiring layer.

According to the above construction, since no dielectric layer is formed, at the time of welding, on at least the portion of the wiring component to which a welding instrument is applied, it is possible to weld the projecting electrode and the electrode pad by heating and pressing the projecting electrode via the exposed wiring layer. Therefore, since there is no intervening resin layer having a low heat conductivity such as in a conventional device, the projecting electrode is supplied with sufficient heat and the problem of the melting of the dielectric layer does not occur. Also, if a protection film is formed on the exposed portion of the wiring layer after the welding, the exposed wiring layer can be easily protected.

In order to prevent the influence of transmitted light, it is preferable to dispose a metal foil between the semiconductor chip and the wiring component. The thickness of the metal foil may be in the range of several μm to several tens of μm. The metal foil may be formed through the intermediary of a protection film on the semiconductor chip surface. Alternatively, the metal foil may be formed on the surface of the insulating board of the wiring component. The semiconductor chip and the wiring component are welded together after the metal foil is formed.

More specifically, the resin-sealed type semiconductor device having a metal foil disposed between the semiconductor chip and the wiring component according to the present invention is manufactured as follows. A metal foil is formed to a thickness of several μm to several tens of μm on the surface of the wiring component to which the semiconductor chip is welded or on the surface of the semiconductor chip where an electric circuit is formed. The projecting electrode of the wiring component and the electrode pad of the semiconductor chip are welded together, and then the gap between the semiconductor chip and the wiring component is sealed with a sealing resin material, thereby forming a contact between the semiconductor chip and the wiring component. External connection terminals may then be formed on the other side of the wiring component.

If a metal foil is provided as shown above, the device will have a structure in which a sealing resin, a metal foil, and an insulating board are laminated on a surface of a semiconductor chip where an electric circuit is formed. Accordingly, since a metal foil is disposed on a surface of a semiconductor chip where an electric circuit is formed, the light transmitted through the insulating board and the sealing resin is intercepted by the metal foil, so that it is possible to prevent the light from being transmitted onto the surface of the semiconductor chip where an electric circuit is formed.

The metal foil formed between the semiconductor chip and the wiring component may be connected to the grounding terminal of the semiconductor chip. Connecting the metal foil to the grounding terminal may provide advantages such as reduction of electric noises.

Figure 18:
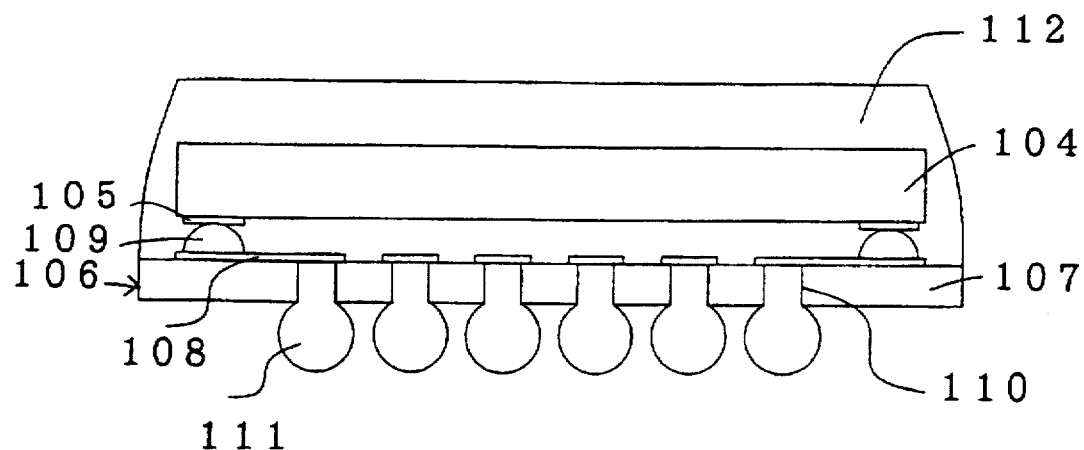
FIG. 18 is a schematic sectional view showing a conventional resin-sealed type semiconductor device.

As shown above, the resin-sealed type semiconductor device of the present invention has a structure in which a projecting electrode is formed immediately above a throughhole, and a wiring layer is formed on the side of the wiring component other than the side to which the semiconductor chip is welded. In this respect, the device of the present invention is structurally different from the conventional resin-sealed type semiconductor device shown in FIG. 18. Moreover, in the present invention, the most suitable structure and material is selected for retaining heat resistance and mechanical strength, for securing a reliability, and for reducing the costs of the resin-sealed type semiconductor devices.

Figure 19:
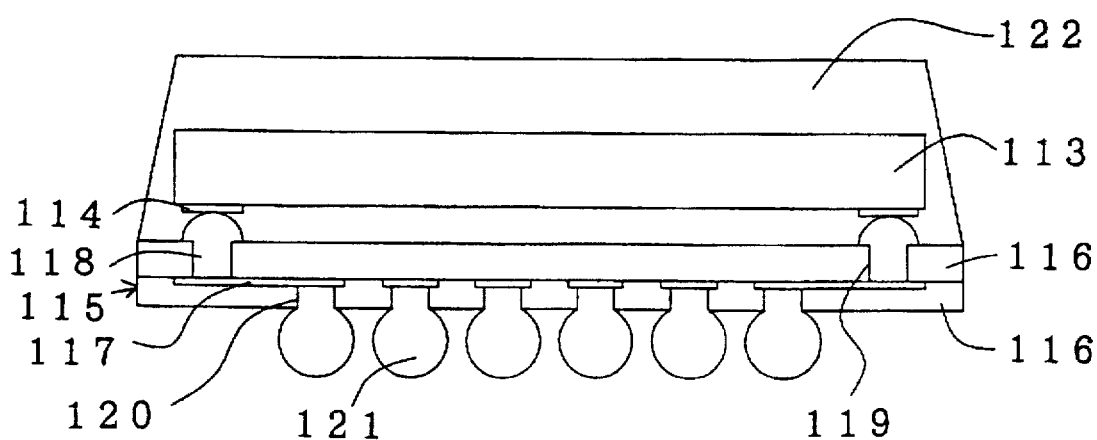
FIG. 19 is a schematic sectional view showing a conventional resin-sealed type semiconductor device.

Next, the device of the present invention is different from the conventional resin-sealed type semiconductor device shown in FIG. 19 with respect to the following points. In the present invention, the insulating board on the wiring layer serves as a base, the wiring layer and the projecting electrode being supported by the insulating board. Thus, it is not necessary to form a protection film in preparing a wiring component. The protection film may be formed in a step of the manufacturing process after the welding is completed. Use of these wiring components makes it possible for a single kind of wiring component to be applied to various different cases. For example, the protection film may be formed beforehand if the wiring layer should be prevented from being exposed due to the need for keeping the external appearance clean such as avoiding dirt.

If reduction of costs is desired, the protection film may be formed after the semiconductor chip and the wiring component are welded, thereby omitting the steps of forming an opening and stuffing the opening. The above-described welding of the electrode pad of the semiconductor chip to the projecting electrode of the wiring component employs heating from the side of the wiring component with a heated welding instrument. However, in the case of heating from the side of the semiconductor chip, it is not necessary to form an opening, so that the number of manufacturing steps does not increase even if a protection film has been formed in advance. Thus, in the wiring component of the resin-sealed type semiconductor device of the present invention, the insulating board serves to support and protect the wiring layer and the projecting electrode, and the protection film serves to merely protect the wiring layer. Accordingly, although the insulating beard requires a significant degree of thickness because of the function it performs, it is not necessary that the protection film is as thick as the insulating board, so that the protection film can be thin in view of reducing the costs. This is one of the structural characteristics of the present invention.

Referring to FIGS. 20(a) (1) to (a) (4) and (b) (1) to (b) (3), the method for manufacturing the conventional resin-sealed type semiconductor device shown in FIG. 19 will be further compared with the method for manufacturing the resin-sealed type semiconductor device of the present invention. FIG. 20(a) (1) to (a) (4) shows a method for manufacturing a conventional resin-sealed type semiconductor device, whereas FIG. 20(b) (1) to (b) (3) shows a method for manufacturing a resin-sealed type semiconductor device of the present invention. In FIGS. 20(a) (1) to (a) (4) and (b) (1) to (b) (3), the reference numeral 123 represents a wiring component, 124 an opening formed through the wiring component, 125 a semiconductor chip, 126 a wiring component, 127 a semiconductor chip, and 128 a protection film.

In the resin-sealed type semiconductor device shown in FIG. 19, the wiring layer is embedded in the dielectric layer, as described above. Therefore, at the time of welding the semiconductor chip and the projecting electrode, a dielectric layer intervenes between the welding instrument and the projecting electrode, causing problems. Accordingly, in the conventional manufacturing method, an opening must be formed at a portion of the dielectric layer to which the welding apparatus is applied (See FIG. 20(a) (2)). Further, a step of burying the opening is needed after the welding is completed (See FIG. 20(a) (4)).

On the other hand, in the present invention, the protection film 128 under the wiring layer need not be formed in advance, so that the conventional step of FIG. 20(a) (2) is unnecessary. Accordingly, the step of burying the opening shown in FIG. 20(a) (4) is also unnecessary. Thus, the present invention can shorten the manufacturing process compared with the conventional device, thus reducing the costs.

In the manufacturing method shown in FIG. 20(b) (1) to (b) (3), it is necessary to support the projecting electrode and the wiring layer by the insulating board only. Therefore, it is one of the characteristics of the present invention that the insulating board has a significant degree of thickness. Since the protection film need not have a supporting function, the protection film may be thinner than the insulating board.

Consequently, the method for manufacturing the resin-sealed type semiconductor device of the present invention can be applied to a wide variety of cases, and a suitable method can be selected depending on the purpose of the product.

The resin-sealed type semiconductor device of the present invention can provide good heat resistance and mechanical strength, securing a reliability and reducing the costs, by selecting the most suitable construction and material. Also, since the external connection terminals comprising solder and the like can be formed in the last step, the problem of melting of the external connection terminals during the manufacturing process does not occur. Further, since the protection film need not be formed in advance at the time of preparing the wiring component, the degree of manufacturing freedom is increased.

EXAMPLES

The present invention will be detailed hereinafter in conjunction with the following preferred embodiments. These embodiments show resin-sealed type semiconductor devices in which the most suitable construction, material and thickness have been selected in view of securing a reliability, producing thinner devices and reducing the costs. The scope of the present invention is not limited by these embodiments.

Example 1

FIG. 1 is a schematic view showing a resin-sealed type semiconductor device according to an embodiment of the present invention. The reference numeral 1 represents a semiconductor chip, 2 an electrode pad, 3 a wiring component, 4 an insulating board, 5 a projecting electrode, 6 a through-hole, 7 a wiring layer, 8 a protection film, 9 an opening, 10 an external connection terminal, and 11 a sealing resin.

The manufacturing method according to the present invention will be hereinafter detailed. FIGS. 2(a) to (e) are views for explaining the manufacturing method.

A wiring component 3 comprises a wiring layer 7 formed on an insulating board 4, the wiring layer 7 being made of Cu, and the insulating board 4 being made of polyimide resin. The thickness of the insulating board 4 is preferably small corresponding to thinning of the resin-sealed type semiconductor device. However, if the thickness is too small, the mechanical strength will come into question. Accordingly, the thickness is preferably about 25 µm. Similarly, the thickness of the wiring layer 7 is preferably about 20 µm. One end of a plurality of wiring layers reaches a position where a projecting electrode 5 is to be formed, and the other end reaches a position where an external connection terminal 10 is to be formed. The wiring layer 7 is formed inside projecting electrode 5. A through-hole 6 is formed on a portion of the insulating board 4 on the wiring layer 7 where the projecting electrode 5 is to be formed.

Figure 3:
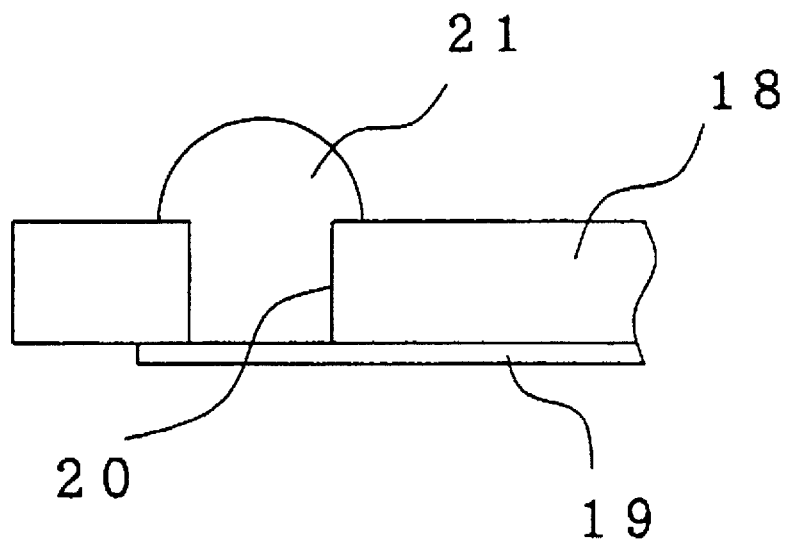
FIGS. 3(a) and (b) are enlarged views showing a principal part of a wiring component used for a resin-sealed type semiconductor device according to the present invention.
Figure 3:
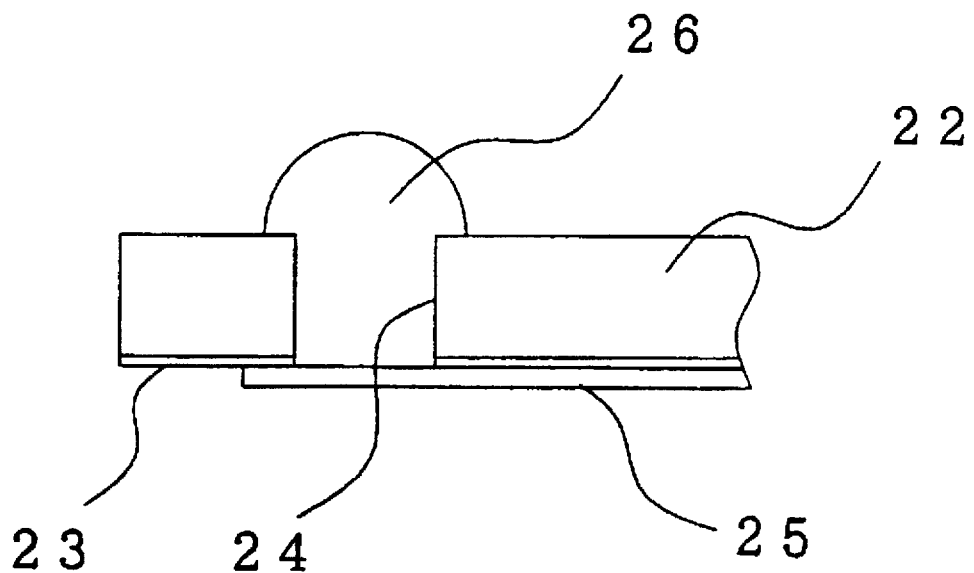

More specifically, as shown in FIG. 3(a), after a wiring layer 19 is formed on one side of an insulating board 18, a through-hole 20 is formed, by laser processing, on a portion of the insulating board 18 where a projecting electrode is to be formed. Thus, the through-hole 20 having an opening diameter of about 60 µm is formed, and a portion of the wiring layer 19 is exposed at the bottom of the through-hole 20. On the inside of the through-hole 20 is formed, by plating or the like, a projecting electrode 21 projecting from the surface of the insulating board and having a length of 80 µm and a thickness of 20 µm.

Alternatively, as shown in FIG. 3(b), a through-hole 24 may be formed, by a drilling method or a die cutting (perforation) method, through the insulating board 22 and an adhesive layer 23 formed on one side thereof, followed by forming a wiring layer 25 via the adhesive layer 23. Thereafter, a projecting electrode 26 is formed in the same manner as in the above FIG. 3(a).

Here, the projecting electrode 26 is made of Cu, the surface of its projecting portion being made of Au through the intermediary of Ni.

A protection film made of polyimide resin is formed on the side of the wiring component where the wiring layer has been formed. The thickness of the protection film is preferably about 10 μm because its main purpose is to provide a protection against the external environment, so that the protection film need not be as thick as the insulating board. Since the protection film must be formed except on the portion of the wiring layer where external connection terminals are to be formed later, openings having a diameter of about 0.5 mm are formed so that the portion of the wiring layer will be exposed. The protection film need not be formed at this stage of the manufacturing process. The above steps complete the wiring component 12 (See FIG. 2(a)).

Next, the electrode pad of the semiconductor chip and the projecting electrode of the wiring component are welded together and sealed with resin. In these steps, resin may be injected between the semiconductor chip and the wiring component after the electrode pad of the semiconductor chip and the projecting electrode of the wiring component are welded together or, alternatively, a sealing resin material may be formed in advance either on the semiconductor chip surface or on the wiring component surface. The above two methods are both possible. In the following embodiment, the case in which a sealing resin material is formed in advance on the wiring component surface will be explained. Here, only the gap between the semiconductor chip and the wiring component is sealed with resin. Alternatively, however, the whole semiconductor chip may be sealed with resin in the same manner as in the case of a conventional resin-sealed type semiconductor device.

Figure 2:
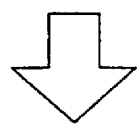
FIGS. 2(a) to (e) are schematic views for explaining a press of manufacturing a resin-sealed type semiconductor device according to the present invention.
Figure 2:
Figure 2:
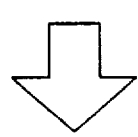
Figure 2:
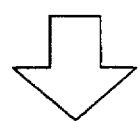
Figure 2:
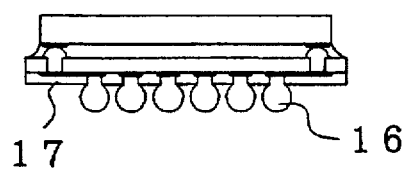

First, a sealing resin material 13 is formed on a wiring component 12 (See FIG. 2(b)). The sealing resin material may be a thermoplastic resin such as polyimide. The resin may be applied on the wiring component or, alternatively, a film-like resin may be disposed on the wiring component. The thickness may be suitably selected depending on the area to be sealed. In this example, the thickness is about a little more than 20 μm.

Alternatively, it is possible to use a wiring component in which the surface layer of the insulating board is made of a sealing resin material.

Next, the semiconductor chip 14 and the wiring component 12 are welded together (See FIG. 2(c)). Namely, the semiconductor chip 14 is placed at a predetermined position on the wiring component 12, followed by heating and pressing. This allows the electrode pad of the semiconductor chip and the projecting electrode of the wiring component to be welded together. Also, the sealing resin is melted, whereby the gap between the semiconductor chip and the wiring component is filled with the resin. When the heated state is maintained, the resin hardens to become a sealing resin 15, thereby completing the welding (See FIG. 2(d)). By this method of welding and sealing, the welding instrument and the heating and pressing instrument for sealing can be applied to the product at the same time for simultaneously performing the welding and the sealing. Alternatively, the welding and the sealing may be carried out separately.

Further, external connection terminals 16 are formed on the side of the wiring layer of the wiring component other than the side to which the semiconductor chip has been welded (See FIG. 2(e)). The external connection terminals 16 are solder bumps. The solder bumps are formed on the wiring layer. The solder bumps are formed by applying a flux onto a portion where the solder bumps are to be formed and then attaching solder balls, followed by heating in the reflow furnace for welding. Another method employs placing a paste-like or sheet-like solder at a portion where the solder bumps are to be formed, followed by heating and melting in a reflow furnace to form the solder into a bump-like shape. In this Example, sixty-four solder bumps having a size of 0.6 mmφ and a pitch of 1.27 mm are disposed in an area-array configuration in the area surrounded by the projecting electrodes or in the semiconductor chip area. This completes the resin-sealed type semiconductor device.

In this Example, before the wiring component is welded to the semiconductor chip, a protection film 17 is formed in advance on a surface of the wiring component where the wiring layer is formed. Alternatively, however, a protection film having openings for forming external connection terminals may be formed before the external connection terminals are formed.

The resin-sealed type semiconductor device manufactured in the above method has a structure such that the electric circuit from the electrode pad of the semiconductor chip to the projecting electrode, the wiring layer, and the external connection terminals is formed under the semiconductor chip. Therefore, the size of the obtained resin-sealed type semiconductor device is approximately the same as the size of the semiconductor chip. Also, the method provides a low-cost resin-sealed type semiconductor device while securing its reliability. Further, the resin-sealed type semiconductor device of this Example has been made in view of thinning the device by allowing the thicknesses of the insulating board, the wiring layer, and the protection film in the wiring component to be as small as possible and by forming a sealing resin only in the gap between the semiconductor chip and the wiring component.

Example 2

The present invention will be further explained by way of Example 2, which is characterized in that the location difference between the semiconductor chip electrode and the projecting electrode at the time of welding (at the time of expansion) is avoided by correcting the position of the projecting electrode of the wiring component in advance so as to facilitate the alignment. The location difference is generated by the difference in thermal expansion between the semiconductor chip and the insulating board which forms a basis for the wiring component. The thermal expansion coefficient of the insulating board is larger than that of the semiconductor chip. Therefore, the correction is made by allowing the spacing between the projecting electrodes on the side of the insulating board smaller than that before the correction by an amount equal to the location difference.

Figure 4:
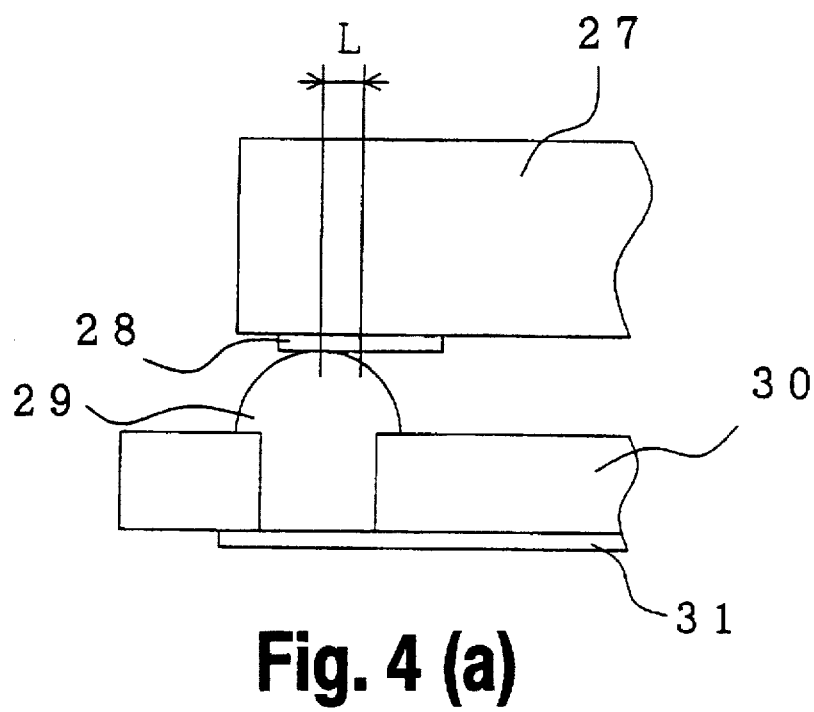
FIGS. 4(a) and (b) are schematic views for explaining a step in a manufacturing process of a resin-sealed type semiconductor device according to the present invention.
Figure 4:
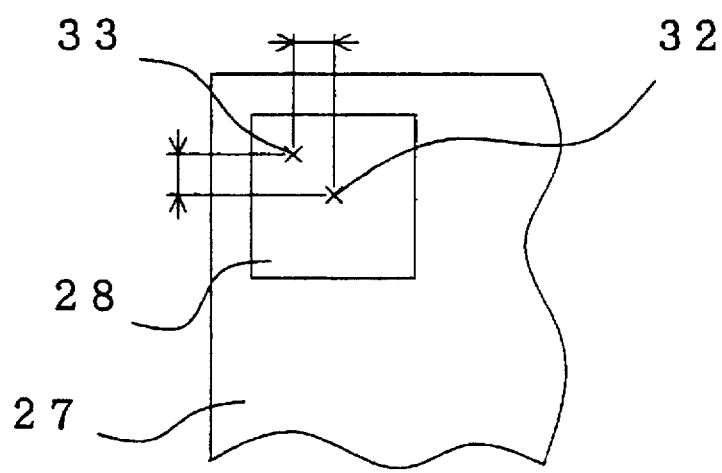

Specifically, the location difference L is measured for each terminal from the center of the electrode after the welding and the real welding point in X and Y directions, as shown in FIGS. 4(a) and (b). By using the measured location difference L as the amount for correction, the position of each of the projecting electrodes in the wiring component is corrected. Referring to FIGS. 4(a) and (b), the reference numeral 27 represents a semiconductor chip, 28 an electrode pad, 29 a projecting electrode of the wiring component, 30 an insulating board of the wiring component, 31 a wiring layer of the wiring component, 32 a center of the electrode pad, and 33 a center of the welding point.

Figure 5:
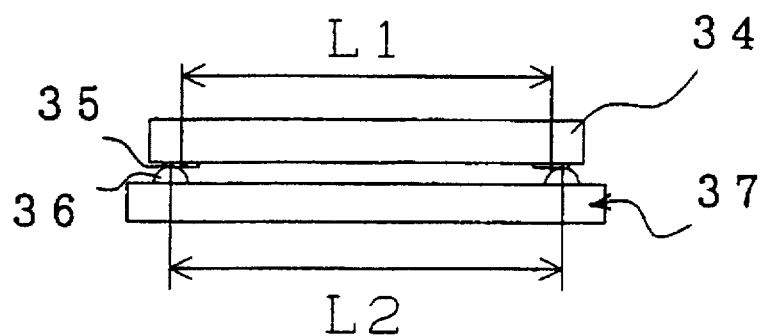
FIGS. 5(a) and (b) are schematic views for explaining a step in a manufacturing process of a resin-sealed type semiconductor device according to the present invention.
Figure 5:
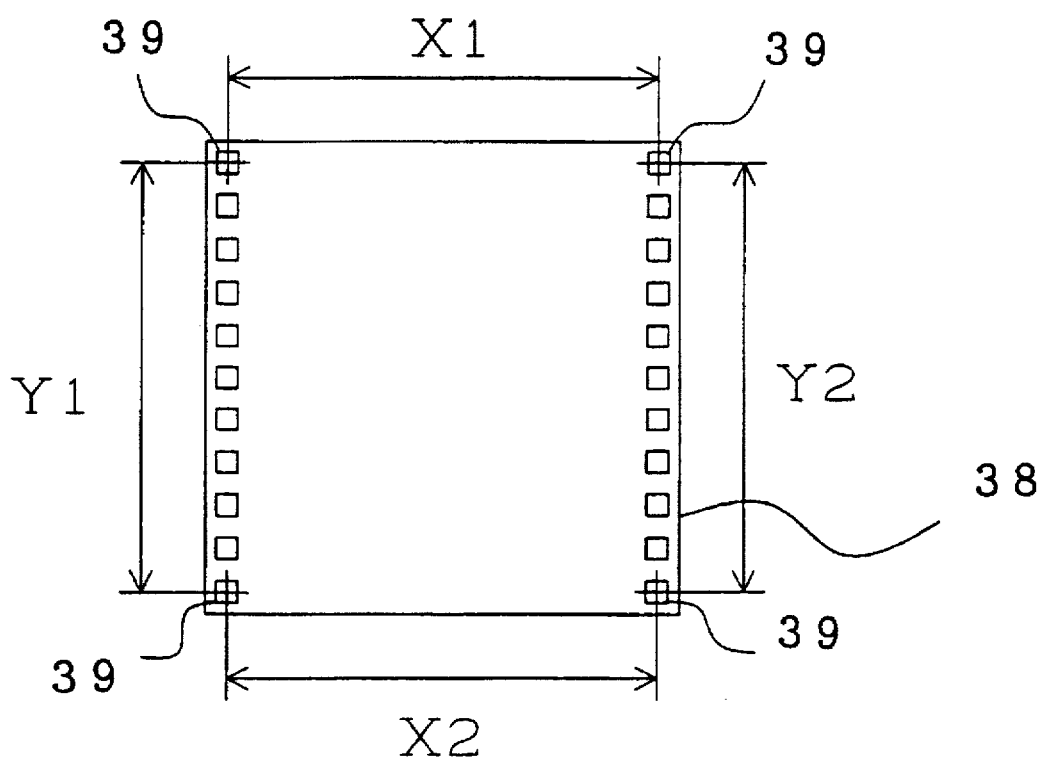

Alternatively, the location difference $L_2-L_1$ is measured with respect to end terminals in X and Y directions, as shown in FIGS. 5(a) and (b). The location difference $L_2-L_1$ will be an amount for correction between the end terminals. The spacing between the intervening terminals is corrected by calculation from the ratio of the spacing of the end terminals before and after the correction. Referring to FIGS. 5(a) and (b), the reference numeral 34 represents a semiconductor chip, 35 an electrode pad, 36 a projecting electrode, 37 a wiring component, 38 a semiconductor chip (or a wiring component), 39 an end electrode pad (or an end projecting electrode).

The location difference between the electrode pad and the projecting electrode at the time of welding can be calculated from the thermal expansion coefficients of the semiconductor chip and the insulating board, the temperature change, and the dimension before the correction, so that the correction can be made in advance even if the measurement is not possible.

The Example will be explained with reference to a specific case in which the size of the semiconductor chip is 12 mm×12 mm and the number of electrodes is sixty-four, the electrodes being disposed in a two-row array at the end of the chip as shown in FIG. 5(b). With respect to the semiconductor chip, a wiring component is prepared with the corrected position of the projecting electrode. The correction is made according to the above method. In this embodiment, the distance between the end terminals (electrodes) is 10 to 12 mm and the location difference is about 30 to 40 μm. With this location difference used as the amount for correction, the position of the projecting electrode is determined. This completes the preparation of the wiring component.

The method for manufacturing the resin-sealed type semiconductor device using the above wiring component is the same as that of Example 1. However, by previously correcting the position of the projecting electrode of the wiring component, it is possible to control the location difference to be less than 1 μm when the electrode pad of the semiconductor chip and the projecting electrode of the wiring component are welded together, as shown in this Example. This facilitates the alignment.

Example 3

Figure 6:
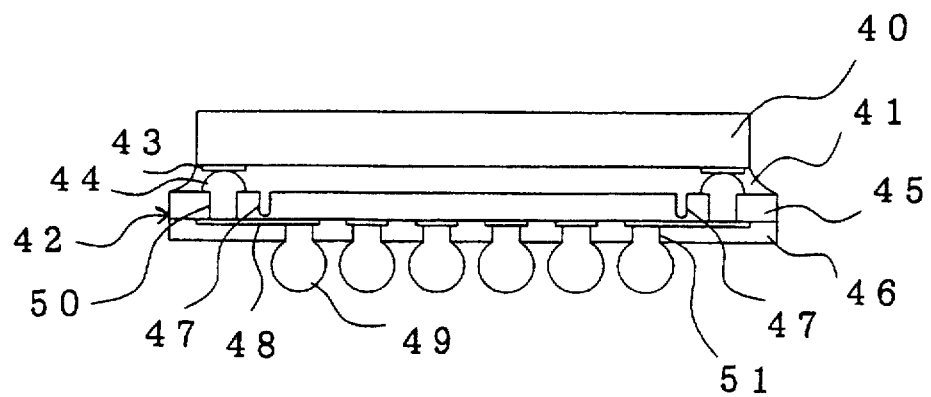
FIG. 6 is a schematic sectional view showing a resin-sealed type semiconductor device according to the present invention.
Figure 7:
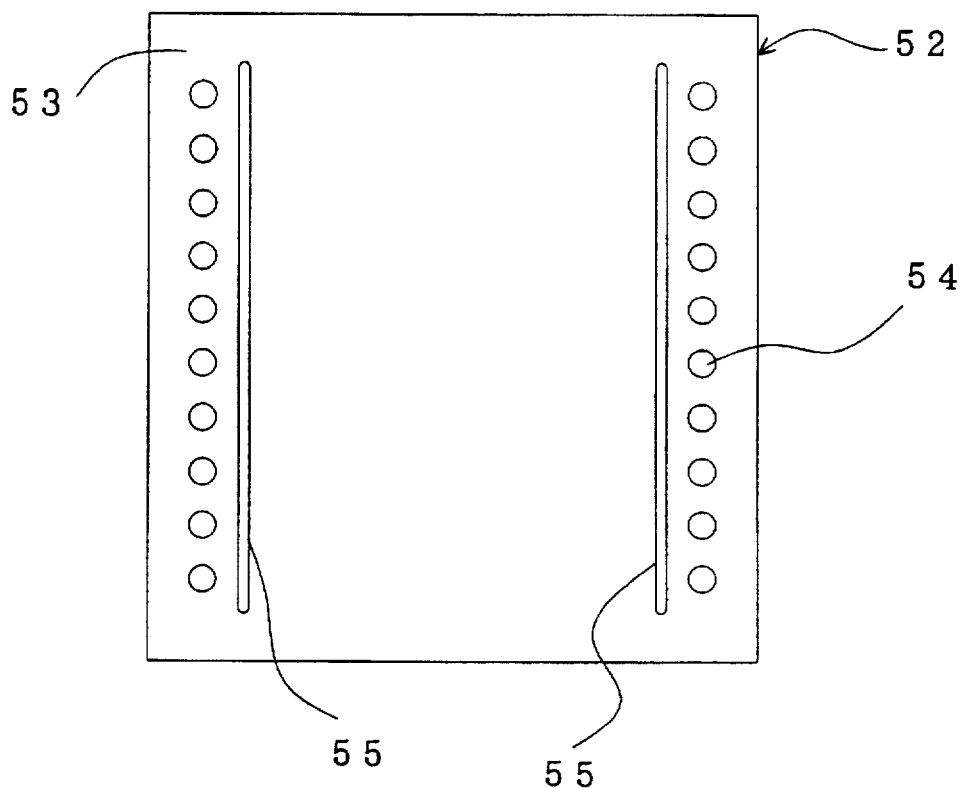
FIG. 7 is a schematic plan view showing a wiring component used for a resin-sealed type semiconductor device according to the present invention.

The present invention will be further detailed by way of Example 3 as shown below. FIG. 6 is a cross sectional view showing an embodiment according to Example 3 of the present invention. In FIG. 6, the reference numeral 40 represents a semiconductor chip, 41 a sealing resin, 42 a wiring component, 43 an electrode pad, 44 a projecting electrode, 45 an insulating board, 46 a protection film, 47 a groove formed in the insulating board, 48 a wiring layer, 49 an external connection terminal, 50 a through-hole for forming a projecting electrode, and 51 an opening for forming the external connection terminal. FIG. 7 is a view of the wiring component used in the resin-sealed type semiconductor device of FIG. 6 as viewed from the semiconductor chip to be welded. In FIG. 7, the reference numeral 52 represents a wiring component, 53 an insulating board, 54 a projecting electrode, and 55 a groove formed in the insulating board. The resin-sealed type semiconductor device according to this Example is characterized by having a groove in the surface of the insulating board where the projecting electrode is formed.

The contact of the wiring component and the semiconductor chip is formed by welding the projecting electrode and the electrode pad together. The welding is carried out in a heated state of about 400° C., so that the semiconductor chip and the wiring component are in an expanded state. Released from the heated state after the welding, the semiconductor chip and the wiring component contract at different contraction ratios while the product is cooled. The contraction ratio of the wiring component is larger than that of the semiconductor chip. Since the semiconductor chip and the wiring component are fixed at peripheral welding sites, a stress is generated at the welding sites by the difference in contraction ratios.

Figure 8:
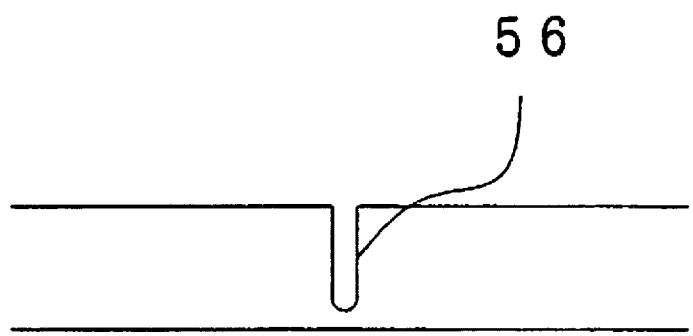
FIGS. 8(a) and (b) are schematic sectional views showing a groove in a wiring component used for a resin-sealed type semiconductor device according to the present invention.
Figure 8:
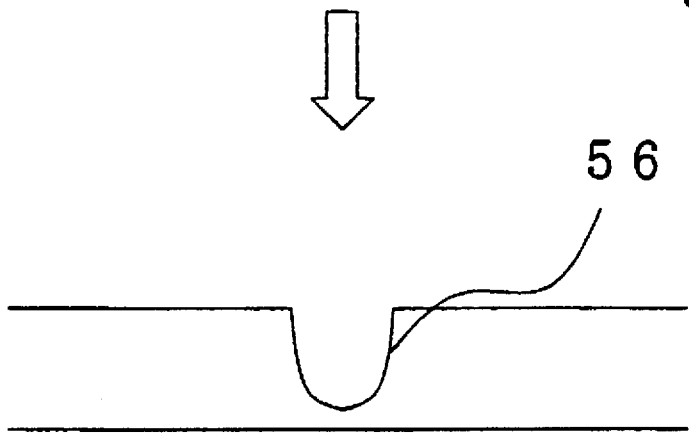

The resin-sealed type semiconductor device shown in FIG. 6 has a groove in a surface of the insulating board. When the semiconductor chip and the wiring component are cooled after being welded together, the groove 56 become deformed from FIG. 8(a) to FIG. 8(b) by the contraction force of the insulating board in the resin-sealed type semiconductor device according to the present invention. Accordingly, the force exerted at the welding sites is alleviated to the extent of the deformation.

A sealing resin may possibly exist between the semiconductor chip and the wiring component at the time of contraction after welding. In such a case, there is a possibility that the amount and the direction of contraction of the wiring component are locally different and complex. In view of this, the grooves are preferably disposed near the projecting electrodes, as shown in FIG. 6. Also, the more grooves are provided, the more preferable. FIGS. 6 and 7 show an example in which the grooves are disposed inside of the projecting electrodes. However, in the case of wiring component having a plurality of wiring elements integrated together, the grooves should preferably be disposed outside of the projecting electrodes or also in a direction perpendicular to the grooves in FIG. 7, because peripheral influences must be considered.

Figure 9:
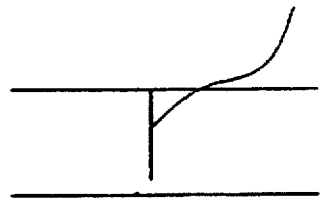
FIGS. 9(a) to (c) are schematic sectional views showing a groove in a wiring component used for a resin-sealed type semiconductor device according to the present invention.
Figure 9:
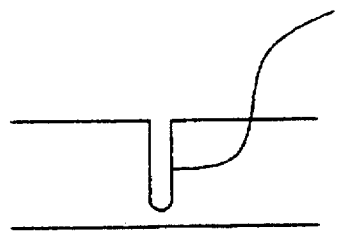
Figure 9:
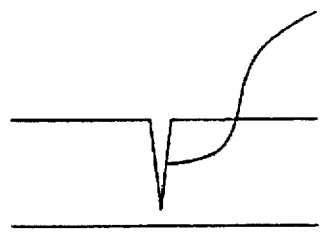

The method for manufacturing the resin-sealed type semiconductor device according to Example 3 will be hereafter explained. First, grooves are formed in a surface of the insulating board in the wiring component where the projecting electrodes have been formed. As shown in FIGS. 9(a) to (c), the shape of the cross section of the groove may be just a cut formed by a cutter (57 in FIG. 9 (a)), a U-shape (58 in FIG. 9 (b)), or a V-shape (59 in FIG. 9(c)). The deeper the groove in the insulating board is, the better. However the depth of the groove should not exceed the extent at which the function of the insulating board as a base is marred. Thereafter, in the same manner as in Example 1, the electrode pad of the semiconductor chip and the projecting electrode of the wiring component are welded together. The gap between the semiconductor chip and the wiring component is then sealed with resin, followed by forming of external connection terminals to complete the device.

Example 4

The present invention will be further detailed by way of Example 4 as shown below. Example 4 is characterized in that the welding instrument the wiring component does not come into contact with the dielectric layer of the wiring component when the electrode pad of the semiconductor chip and the projecting electrode of the wiring component are welded together. Also, Example 4 is characterized in that a protection film is formed at an exposed portion of the wiring layer after the welding. In the wiring component to be used, no protection film should exist on at least the portion to which the welding instrument is applied, and the portion of the wiring layer under the projecting electrode should be exposed at the time of welding.

Figure 10:
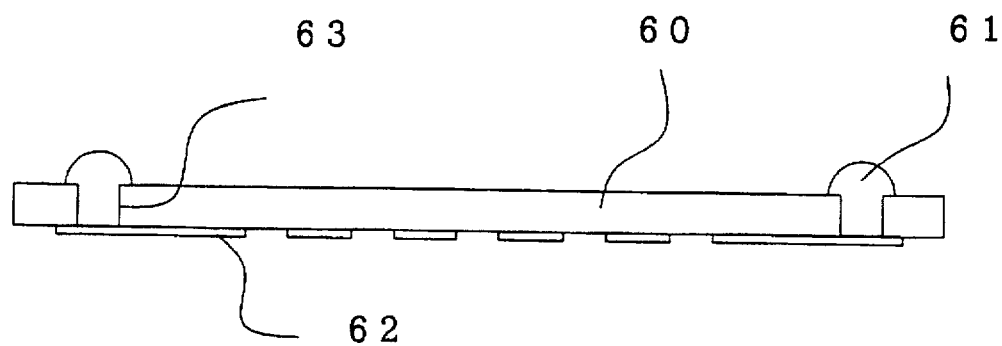
FIG. 10 is a schematic sectional view showing a wiring component used for a resin-sealed type semiconductor device according to the present invention.
Figure 11:
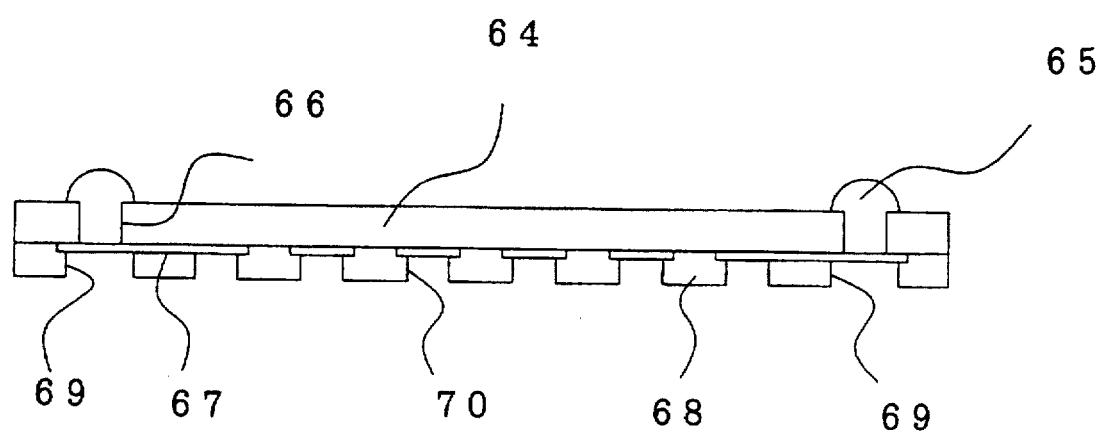
FIG. 11 is a schematic sectional view showing a wiring component used for a resin-sealed type semiconductor device according to the present invention.

FIG. 10 shows an example in which no protection film has been formed. Referring to FIG. 10, the reference numeral 60 represents an insulating board, 61 a projecting electrode, 62 a wiring layer, and 63 a through-hole. FIG. 11 shows an example in which openings are formed only on a portion of the protection film where external connection terminals are to be formed and on a portion of the protection film which is under the projecting electrode and to which the welding instrument is applied. Referring to FIG. 11, the reference numeral 64 represents an insulating board, 65 a projecting electrode, 66 a through-hole, 67 a wiring layer, 68 a protection film, 69 an opening under the projecting electrode, and 70 an opening at a portion where external connection terminals are to be formed.

Figure 12:
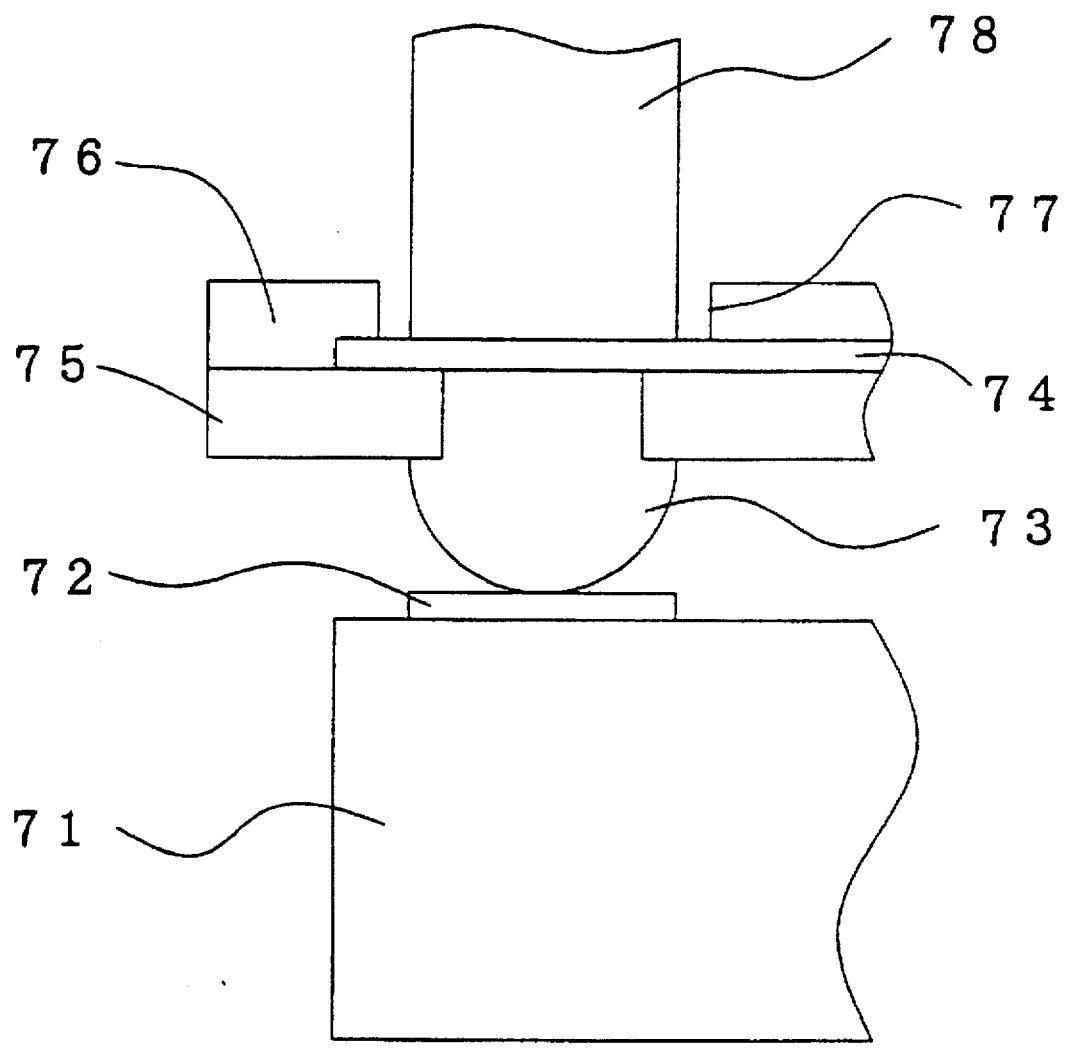
FIG. 12 is a schematic view for explaining a step in a manufacturing process of a resin-sealed type semiconductor device according to the present invention.

The method for manufacturing the resin-sealed type semiconductor device according to the present invention will be hereinafter explained with respect to the case in which the wiring component of FIG. 11 is used. FIG. 12 is a view showing the vicinity of the projecting electrode at the time of welding. The reference numeral 71 represents a semiconductor chip, 72 an electrode pad, 73 a projecting electrode, 74 a wiring layer, 75 an insulating board, 76 a protection film, 77 an opening, and 78 a welding instrument. The welding is performed by allowing the welding instrument at 400° C. to be in contact with the exposed wiring layer, heating the projecting electrode through the intermediary of the wiring layer, and simultaneously pressing the projecting electrode against the semiconductor chip. The Example 4 does not employ the conventional method of performing the welding through the intermediary of the resin layer, so that the heat conduction is improved and the resin layer does not melt.

Thereafter, the gap between the semiconductor chip and the wiring component is sealed with resin and the external connection terminals are formed in the same manner as in Example 1. Also, after the semiconductor chip and the wiring component are welded together, a protection film is formed at the opening 77 having the exposed wiring layer to complete the device.

Similarly, in the case of the wiring component shown in FIG. 10, the projecting electrode is heated and pressed through the intermediary of the wiring layer by allowing the welding instrument to be in contact with the exposed wiring layer. After the welding, a protection film is formed except on a portion where external connection terminals are to be formed. Further, in the case of the wiring component shown in FIG. 10, the whole protection film is formed after the semiconductor chip and the wiring component are welded together, thus eliminating the steps of forming an opening such as shown at 77 in the protection film and of forming the protection film two times.

Example 5

Figure 13:
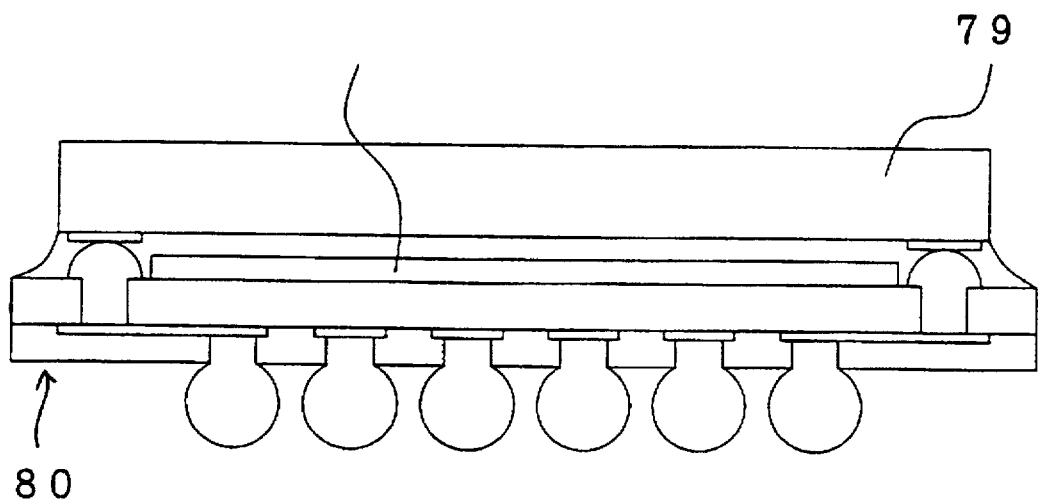
FIG. 13 is a schematic sectional view showing a resin-sealed type semiconductor device according to the present invention.
Figure 14:
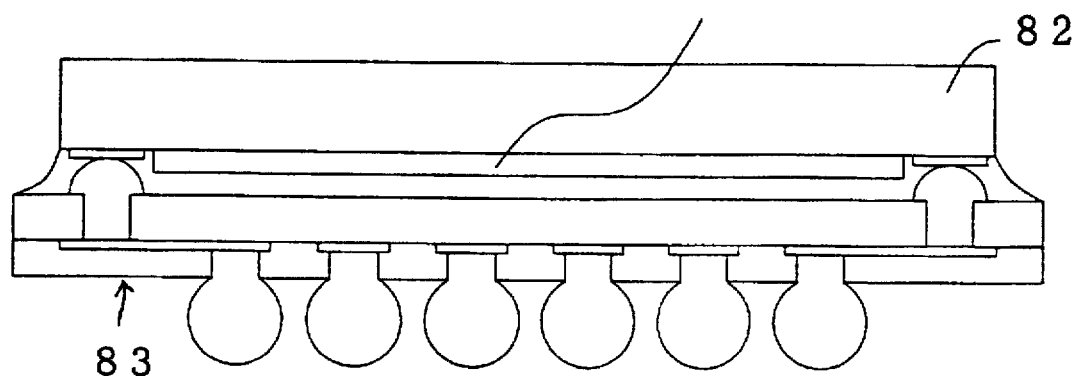
FIG. 14 is a schematic sectional view showing a resin-sealed type semiconductor device according to the present invention.

The present invention will be hereinafter detailed by way of Example 5, which is characterized by having a metal foil disposed between the semiconductor chip and the wiring component. FIG. 13 is a cross-sectional view showing a resin-sealed type semiconductor device having a metal foil formed on the surface of the wiring component. The reference numeral 79 represents a semiconductor chip, 80 a wiring component, and 81 a metal foil. FIG. 14 is a cross-sectional view showing a resin-sealed type semiconductor device having a metal foil formed on the surface of the semiconductor chip. The reference numeral 82 represents a semiconductor chip, 83 a wiring component, and 84 a metal foil.

The method for manufacturing the resin-sealed type semiconductor device according to the present invention will be hereinafter explained by way of an example shown in FIG. 13. Here, the wiring component 85 similar to the one in Example 1 is used (See FIG. 15(a)). By using, as a base, an insulating board having a thickness of about 25 μm and made of polyimide, a wiring layer having a thickness of 20 μm and made of Cu is formed on one side of the insulating board. In a through-hole there is formed a projecting electrode protruding by 20 μm from the surface of the insulating board. The protection film need not be formed at this step.

Figure 15:
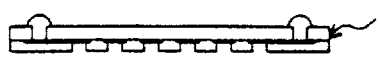
FIGS. 15(a) to (e) are schematic views for explaining a process of manufacturing a resin-sealed type semiconductor device according to the present invention.
Figure 15:
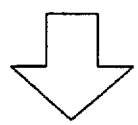
Figure 15:
Figure 15:
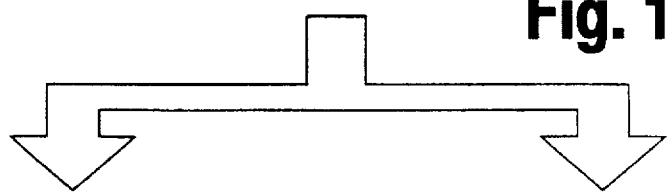
Figure 15:
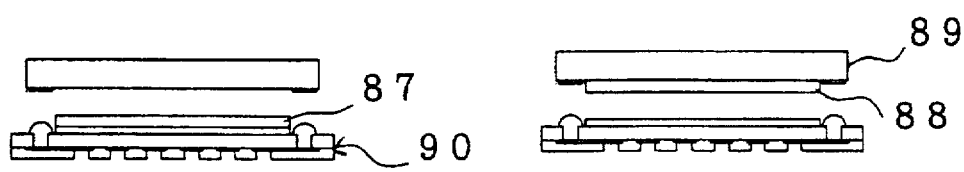
Figure 15:
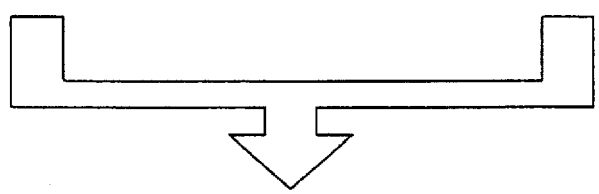
Figure 15:
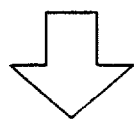
Figure 15:
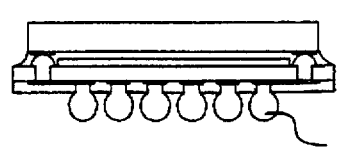

Then, a metal foil 86 is formed on a surface of the insulating board of the wiring component where the projecting electrode is to be formed (See FIG. 15(b)). The metal foil can be formed by a plating method. The metal foil is made of Cu and has a thickness of 10 μm. The material for the metal foil is not limited to Cu only. The thickness may be as small as about several μms. In the case of the resin-sealed type semiconductor device shown in FIG. 14, the metal foil is formed, through the intermediary of an adhesive layer serving also as a protection film, on a surface of the semiconductor chip where an electric circuit is formed.

Next, the semiconductor chip and the wiring component are welded together and sealed with resin. It is possible to inject a resin into the gap after the welding or to dispose a sealing resin material on the semiconductor chip or on the wiring component in advance, as in the manufacturing method of Example 1.

In this case, however, since the metal foil is formed in the gap between the wiring component and the semiconductor chip initially having a thickness of about several tens of μm, it is not easy to inject a resin after the metal foil is formed. Therefore, it is preferable that a sealing resin material (87, 88) is disposed in advance on the semiconductor chip side 89 or on the wiring component side 90 (See FIG. 15(c)). For the sealing resin material, a layer of a thermosetting polyimide resin is formed to a thickness of about a little more than 10 μm, in the same manner as in Example 1.

Then, the semiconductor chip and the wiring component are aligned at a predetermined position, and heated and pressed with a welding instrument. By this heating and pressing, the electrode pad 91 of the semiconductor chip and the projecting electrode 92 of the wiring component are welded together, and the sealing resin 93 is melted to fill the gap between the semiconductor chip and the wiring component (See FIG. 15(d)).

Further, the external connection terminals 94 are formed, in the same manner as in FIG. 2(e), to complete the device (See FIG. 15(e)).

Example 6

Figure 16:
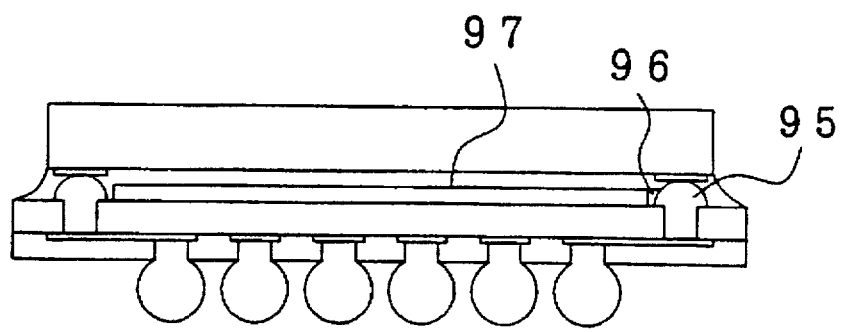
FIG. 16 is a schematic sectional view showing a resin-sealed type semiconductor device according to the present invention.
Figure 17:
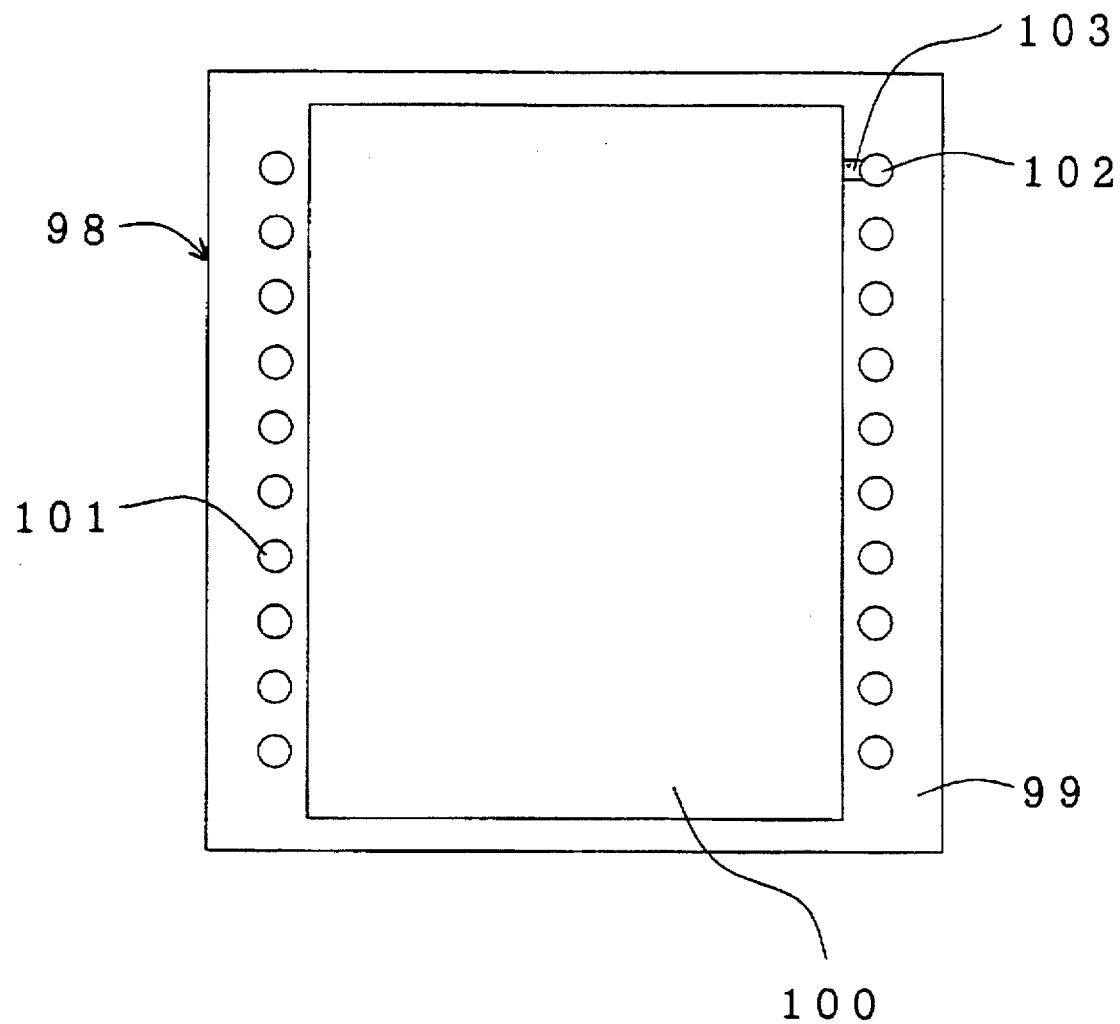
FIG. 17 is a schematic plan view showing a wiring component used for a resin-sealed type semiconductor device according to the present invention.

The present invention will be hereinafter detailed by way of Example 6, which is characterized in that the metal foil formed between the semiconductor chip and the wiring component is connected to a grounding terminal. FIG. 16 is a cross sectional view showing a resin-sealed type semiconductor device according to Example 6 of the present invention. The reference numeral 95 represents a projecting electrode, 97 a metal foil, and 96 a connecting portion connecting the metal foil with the projecting electrode corresponding to the grounding terminal of the semiconductor chip. FIG. 17 is a top view showing a wiring component having a metal foil used for the resin-sealed type semiconductor device of FIG. 16. The reference numeral 98 represents a wiring component, 99 an insulating board, 100 a metal foil, 101 a projecting electrode, 102 a projecting electrode corresponding to a grounding terminal, and 103 a connecting portion connecting the projecting electrode with the metal foil.

The resin-sealed type semiconductor device according to this Example needs a step of forming a connecting portion 103 to the metal foil. The other steps are performed in the same manner as in the manufacturing steps of FIGS. 15(a) to (e). In this Example, the metal foil is on the wiring component. However, in an example such as shown in FIG. 14 having a metal foil formed on a semiconductor chip, a connecting portion is formed between the metal foil and the grounding terminal of the semiconductor chip.

The resin-sealed type semiconductor device and the manufacturing method thereof according to the present invention are the most suitable for securing the reliability and for reducing the costs. Having a structure different from conventional ones, the device can be flexibly applied to various cases, which leads to reduction of costs.

Moreover, since the position of the projecting electrode of the wiring component is corrected in advance in the resin-sealed type semiconductor device according to the present invention, there does not occur a location difference due to the difference in thermal expansion coefficients when the electrode pad of the semiconductor chip and the projecting electrode of the wiring component are welded together. This facilitates the alignment of the electrode pad and the projecting electrode, contributing to less difficult production.

Also, by forming a groove in the insulating board on a surface of the wiring component where a projecting electrode is formed, it is possible to alleviate the stress generated at the point of contact due to the difference in contraction ratios between the semiconductor chip and the wiring component after the electrode pad and the projecting electrode are welded together. This provides a resin-sealed type semiconductor device having a highly reliable point of contact.

Further, in the resin-sealed type semiconductor device according to the present invention, the welding instrument does not come into contact with the dielectric layer of the wiring component when the electrode pad of the semiconductor chip and the projecting electrode of the wiring component are welded together. Therefore, there will occur no such problems as the meltage of the dielectric layer or the poor contact due to insufficient heat applied to the point of contact. This leads to increase in the yield and improvement of the reliability.

The resin-sealed type semiconductor device according to the present invention has a metal foil formed between the wiring component and the surface of the semiconductor chip where an electric circuit is formed. This metal foil prevents the penetration of light transmitted through the insulating board of the wiring component from outside. As a result, it is possible to prevent erroneous operation of the electric circuit caused by light because the light does not reach the surface of the semiconductor chip where the electric circuit is formed. This provides a reliable resin-sealed type semiconductor device.

Also, by disposing a metal foil connected to the grounding terminal, reduction of the generated electric noise can be expected, which is effective in a high speed device.

What we claim is:

1. A resin-sealed type semiconductor device comprising:

a semiconductor chip having an electrode pad;

a wiring component composed of a wiring layer formed on one side of an insulating board, a through-hole penetrating through the insulating board and a projecting electrode formed on the other side of the insulating board and at the position corresponding to the through-hole;

said semiconductor chip and said wiring component being disposed so that the electrode pad and the projecting electrode are welded together, and at least the gap between the semiconductor chip and the wiring component is sealed with a resin, the insulating board having a surface along one side thereof and a groove in said surface only partially penetrating between opposite sides of said insulating board.

2. A resin-sealed type semiconductor device according to claim 1, in which the semiconductor chip has at least two equally-spaced electrode pads, and the wiring component has at least two projecting electrodes disposed with the almost same spacing as the electrode pads.

3. A resin-sealed type semiconductor device according to claim 1, in which a metal foil is disposed between the semiconductor chip and the wiring component, and the metal foil is connected to the grounding terminal of the resin-sealed type semiconductor device.

4. A method for manufacturing a resin-sealed type semiconductor device, the method comprising the steps of:

forming a wiring layer on one side of an insulating board;

forming a through-hole penetrating through the insulating board;

the through-hole opening on the other side of the insulating board at a position corresponding to the location of an electrode pad of a semiconductor chip to be welded;

forming a wiring component by forming a projecting electrode on the wiring layer and through the through-hole, said wiring component and said semiconductor chip having different coefficients of thermal expansion;

sealing at least the gap between the semiconductor chip and the wiring component with a resin;

welding the electrode pad and the projecting electrode together by heating the wiring layer; and forming a groove in a surface of said insulating board to compensate for differential contraction of the semiconductor chip and insulating board, subsequent to welding and without complete penetration between opposite sides of said insulating board, thereby alleviating shear stress generated at the weld between the electrode pad and the projecting electrode.

5. A method according to claim 4 wherein the wiring component and the semiconductor chip have different coefficients of thermal expansion, and including the steps of determining, prior to welding, a location discrepancy between the semiconductor chip and the wiring component due to the difference in thermal expansion thereof at ambient and welding temperatures and using the determined location discrepancy to match the positions of the projecting electrode and the semiconductor chip electrode pad substantially at the welding temperature.

6. A method according to claim 4 including the step of, subsequent to welding, applying a dielectric layer to exposed portions of said wiring layer on said one side of said insulating board.

7. A method according to claim 4 wherein during welding the wiring layer is exposed along said one side of said insulating board, and subsequent to welding, applying a dielectric layer to said exposed portions of said wiring layer on said one side of said insulating board.

8. A method according to claim 4 including the steps of determining, prior to welding, a location discrepancy between the semiconductor chip and the wiring component due to the difference in thermal expansion thereof at ambient and welding temperatures and using the determined location discrepancy to match the positions of the projecting electrode and the semiconductor chip electrode pad substantially at the welding temperature.

9. A method according to claim 4 including disposing a metal foil between the semiconductor chip and the wiring component.

10. A method according to claim 4 including disposing a metal foil on said wiring component prior to welding the electrode pad and the projecting electrode together.

11. A method according to claim 4 including disposing a metal foil between the semiconductor chip and the wiring component, said semiconductor chip having a grounding terminal, and connecting the grounding terminal to the semiconductor chip.

* * * * *